United States Patent [19]
Kato et al.

[11] 4,357,579
[45] Nov. 2, 1982

[54] POWER AMPLIFIER

[75] Inventors: Shuichi Kato; Hiromi Kusakabe; Hiroyasu Yamaguchi; Yoshihiro Yoshida, all of Yokohamashi, Japan

[73] Assignee: Tokyo Shibaura Denki Kabushiki Kaisha, Japan

[21] Appl. No.: 195,131

[22] Filed: Oct. 8, 1980

[30] Foreign Application Priority Data

Dec. 20, 1979 [JP] Japan .............. 54-176638[U]

[51] Int. Cl.³ .............................................. H03F 3/26
[52] U.S. Cl. .................................... 330/297; 330/267
[58] Field of Search ............... 330/297, 267, 149, 262

[56] References Cited
U.S. PATENT DOCUMENTS

| | | | |
|---|---|---|---|
| 3,383,613 | 5/1968 | Novak | 330/297 |
| 3,421,098 | 1/1969 | Fisher | 330/297 |
| 3,988,691 | 10/1976 | Shih | 330/297 |

OTHER PUBLICATIONS

Japanese magazine "Musen to Jikken", Feb. 1980, p. M. J FAX 342.

Primary Examiner—James B. Mullins
Assistant Examiner—Gene Wan
Attorney, Agent, or Firm—Finnegan, Henderson, Farabow, Garrett & Dunner

[57] ABSTRACT

A power amplifier is supplied a DC power source voltage to its power-amplifying circuit from a switching regulator type DC power source. A driver circuit is supplied its DC power source voltage from a non-switching regulator type DC power source like a battery or a series regulator type DC power source, and the DC power source voltage for the driver circuit is limited to a level below the DC power source voltage for the power amplifying circuit to reduce or eliminate spurious emissions based on ripple voltage components on the signal supplied by the DC power source voltage.

6 Claims, 5 Drawing Figures

POWER AMPLIFIER

FIELD OF THE INVENTION

This invention relates to a power amplifier, and in particular, to a power amplifier with low power consumption and low undesired radiation.

BACKGROUND OF THE INVENTION

A long sought objective in the amplifier art has been to obtain a power amplifier having a higher efficiency of power consumption. Therefore, power amplifiers have been provided with a switching regulator as a power supply means in recent years. The switching regulator has higher efficiency of power consumption and occupies less space than conventional series regulator type power supply means. The switching regulator, however, has a shortcoming in that it has high frequency ripple components in the output current.

As a result, the power amplifier driven by the switching regulator is apt to have undesired radiation resulting from the amplified high frequency ripple components of the output of the power amplifier. Furthermore, the output signal from the power amplifier is distorted by the high frequency ripple components.

SUMMARY OF THE INVENTION

Accordingly, an object of the present invention is to provide a power amplifier which reduces or prevents leakage of high frequency ripple components caused by a switching regulator type power supply source.

A further object of the present invention is to provide a power amplifier which does not radiate undesired radio jamming signals stemming from high frequency ripple components leaking from a switching regulator type power supply source.

A still further object of the present invention is to provide a power amplifier whose output signal is minimally distorted by high frequency ripple components generated by a switching regulator type power supply source.

According to the present invention, the power amplifier is provided with: (a) a signal input circuit; (b) a driver circuit connected to the signal input circuit including a driver transistor which amplifies an input signal from the signal input circuit; (c) an output circuit; (d) a power amplifying circuit coupled between the driver circuit and the output circuit including a power transistor which power-amplifies a signal from the driver circuit and provides a power-amplified output signal to the output circuit; (e) first power supply means connected to the power amplifier circuit for supplying a first DC power source voltage which includes ripple components to the power transistor; and (f) second power supply means connected to the driver circuit for supplying a second DC power source voltage which is a lower voltage than the first DC power source voltage and includes lesser ripple components than the first DC power source voltage to the driver transistor.

Additional objects and advantages of the present invention will become apparent to persons skilled in the art from a study of the following description of the accompanying drawings, in which:

DESCRIPTION OF THE PREFERRED EMBODIMENTS

The present invention will be described in detail with reference to the accompanying drawings FIGS. 1 to 5.

Figure 1:
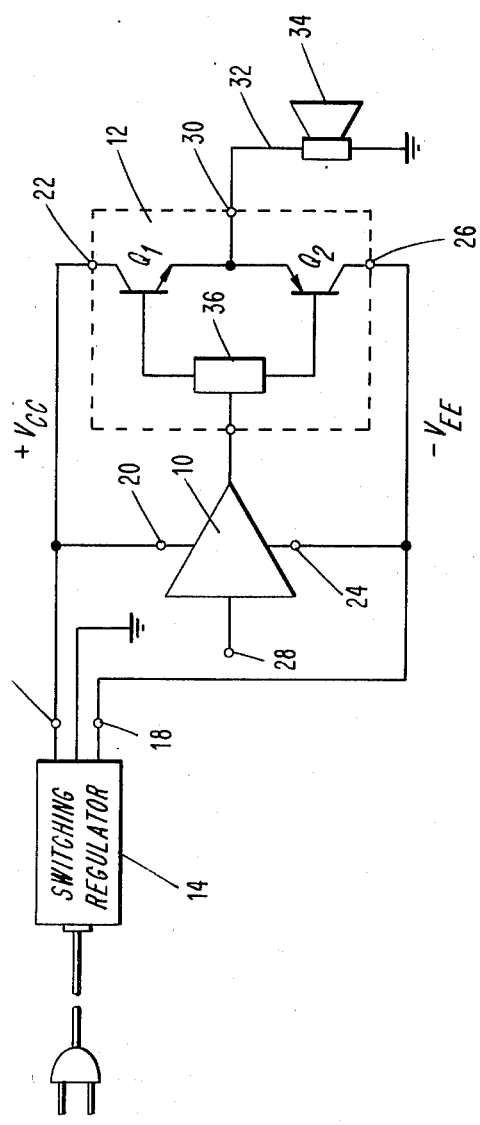
FIG. 1 shows a schematic circuit diagram of the prior art power amplifier.

FIG. 1 shows a known power amplifier to which this invention is an improvement for amplifying an audio signal to drive a load, such as a loudspeaker. This power amplifier employs a switching regulator. In FIG. 1, a driver circuit 10 and a power amplifying circuit 12 are both supplied power from a common switching regulator 14. As shown, positive and negative source output terminals 16 and 18 of the switching regulator 14 are respectively connected to positive power source terminals 20 and 22 and negative power source terminals 24 and 26 of driver circuit 10 and power amplifying circuit 12. The output signal of driver circuit 10 is supplied to transistors $Q_1$ and $Q_2$ of power amplifying circuit 12 through bias circuit 36. Therefore, in the power amplifier of FIG. 1, both driver circuit 10 and power amplifying circuit 12 are supplied with the same power source voltage.

When a large input signal is applied to signal input terminal 28 of the power amplifier, peak portions of positive and negative half cycles of the signal-waveform of the input signal are amplified to the full extent of the power source voltages in the driver circuit so that the peak portions of the output signal of driver circuit 10 are clipped to the level of the power source voltages. Since, as mentioned above, the power source voltage includes high frequency ripple components, i.e., the power source voltage is modulated by the high frequency ripple components, the clipped portions of the output signal are also modulated by the high frequency ripple components.

Figure 2:
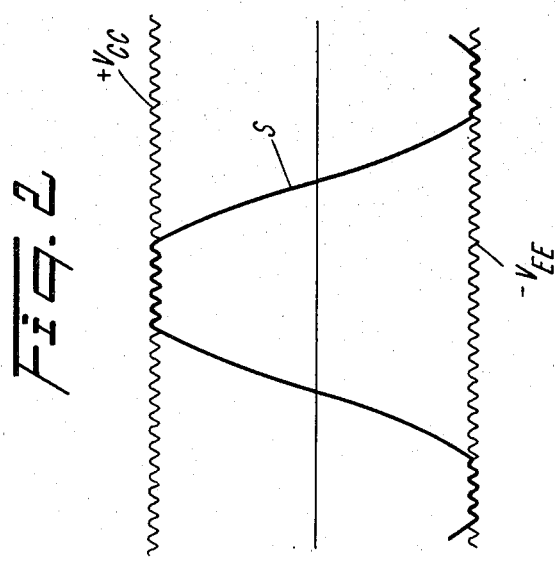
FIG. 2 shows an output current waveform associated with the circuit of FIG. 1.

The waveforms of the output signal S and the positive and negative power source voltages $V_{cc}$ and $-V_{EE}$ are shown in FIG. 2.

The output signal of driver circuit 10 is amplified by power amplifying circuit 12. The power amplifying circuit amplifies the output signal from the driver circuit to a high power level by controlling the current that flows from the power source through the power transistors $Q_1$ and $Q_2$ which comprise the power amplifying circuit. Since current flowing through a transistor varies according to the voltage across its collector and emitter terminals, as long as the voltage difference is low, when a high input voltage close to the power source voltage is applied, the voltages across the collector and emitter terminals of power transistors $Q_1$ and $Q_2$ become low so that the output current flowing through the transistors $Q_1$ and $Q_2$ varies according to variation of the collector voltage, here the high frequency ripple components. In addition, the input signal of driver circuit 10 is modulated by the high frequency ripple components. The modulated output signal of driver circuit 10 which is applied as the input signal to power amplifying circuit 12 is further modulated by the high frequency ripple components. Therefore, the output signal of power amplifying circuit 12 is extremely distorted by the high frequency ripple components resulting in a distorted sound being reproduced from loudspeaker 34. Furthermore, the amplified high frequency ripple components radiated from output terminal 30 of power amplifying circuit 12 and the cable 32 connecting output terminal 30 and loudspeaker 34 create radio-frequency interference problems by jamming radio transmissions.

Figure 3:
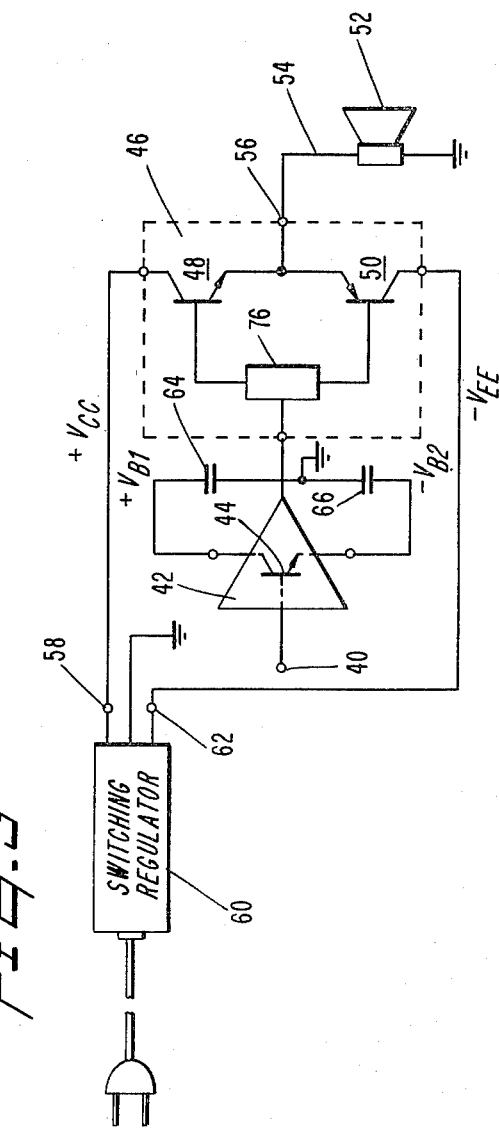
FIG. 3 shows a schematic circuit diagram of a power amplifier embodying the present invention.

Referring now to FIG. 3, there is shown a power amplifier of one embodiment constructed according to this invention. A signal input circuit 40 supplies an audio frequency input signal to a driver circuit 42 including a driver transistor 44. Amplifying circuit 46 includes a pair of power transistors 48 and 50. Power transistors 48 and 50 are a complementary pair which drive a loudspeaker 52 through a cable 54 coupled between loudspeaker 52 and output terminal 56 of power amplifying circuit 46. NPN power transistor 48 is supplied a positive power source voltage ($+V_{cc}$) at its collector from positive terminal 58 of switching regulator 60. PNP power transistor 50 is supplied a negative power source voltage ($-V_{EE}$) at its collector from negative terminal 62 of the switching regulator 60. Switching regulator 60 converts a commercial AC power to a pair of positive and negative DC voltages which are properly regulated by means of switching method using a high frequency in the order of several tens of kilohertz.

Driver transistor 44 is supplied with another pair of positive and negative voltages $+V_{B1}$ and $-V_{B2}$ respectively from a pair of batteries 64 and 66. Batteries 64 and 66 supply voltages $+V_{B1}$ and $-V_{B2}$ which are of lesser magnitude than the respective voltages $+V_{cc}$ and $-V_{EE}$ of switching regulator 60.

In operation of the power amplifier, when the input signal increases beyond a certain voltage level, driver transistor 44 operates in a complete cut-off condition or a complete conductive condition. Accordingly, the output signal from driver circuit 42 is clipped at the battery voltages $+V_{B1}$ and $-V_{B2}$ as shown by waveform S' in FIG. 4. Power transistors 48 and 50 are driven by the clipped signal from driver circuit 42 through bias circuit 76 so that a voltage amplitude of the output signal from the output terminal 56 is limited to the extent of the same voltage waveform. Therefore, the operating region of power transistors 48 and 50 may be confined to their active regions wherein their respective amount of collector-emitter voltages are held to a selected level even when the clipped signal is supplied to power amplifying circuit 46. As a result, neither current through NPN power transistor 48 or PNP power transistor 50 are affected by ripple components included in the respective DC voltages $+V_{cc}$ and $-V_{EE}$.

This means that leakages of high frequency or higher harmonics at terminals 58 and 62 of switching regulator 60 are prevented from modulating the signal at output terminal 56. Accordingly, a spurious emission caused by the high frequency switching signal in switching regulator 60 from cable 54 is considerably limited.

Figure 4:
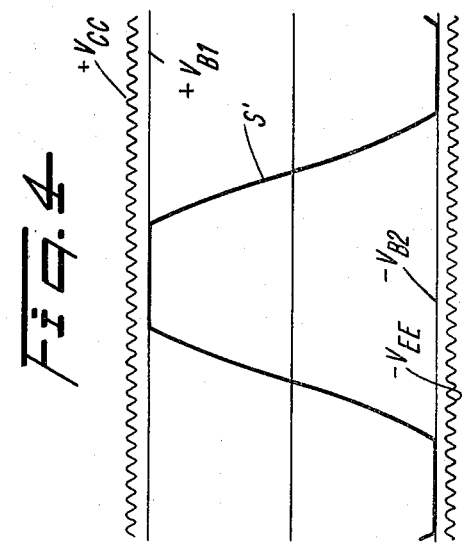
FIG. 4 shows an output current waveform associated with the circuit of FIG. 3.

In FIG. 4, there are shown relations of output signal S' from power amplifying circuit 46, DC power source voltages $+V_{B1}$ and $-V_{B2}$ of batteries 64 and 66 and DC voltages $+V_{cc}$ and $-V_{EE}$ including high frequency ripples from switching regulator type DC power source 60. The waveform of the output signal S' is shown under the condition that the waveform is within the envelope or the waveform of output signal S' from driver circuit 42.

Figure 5:
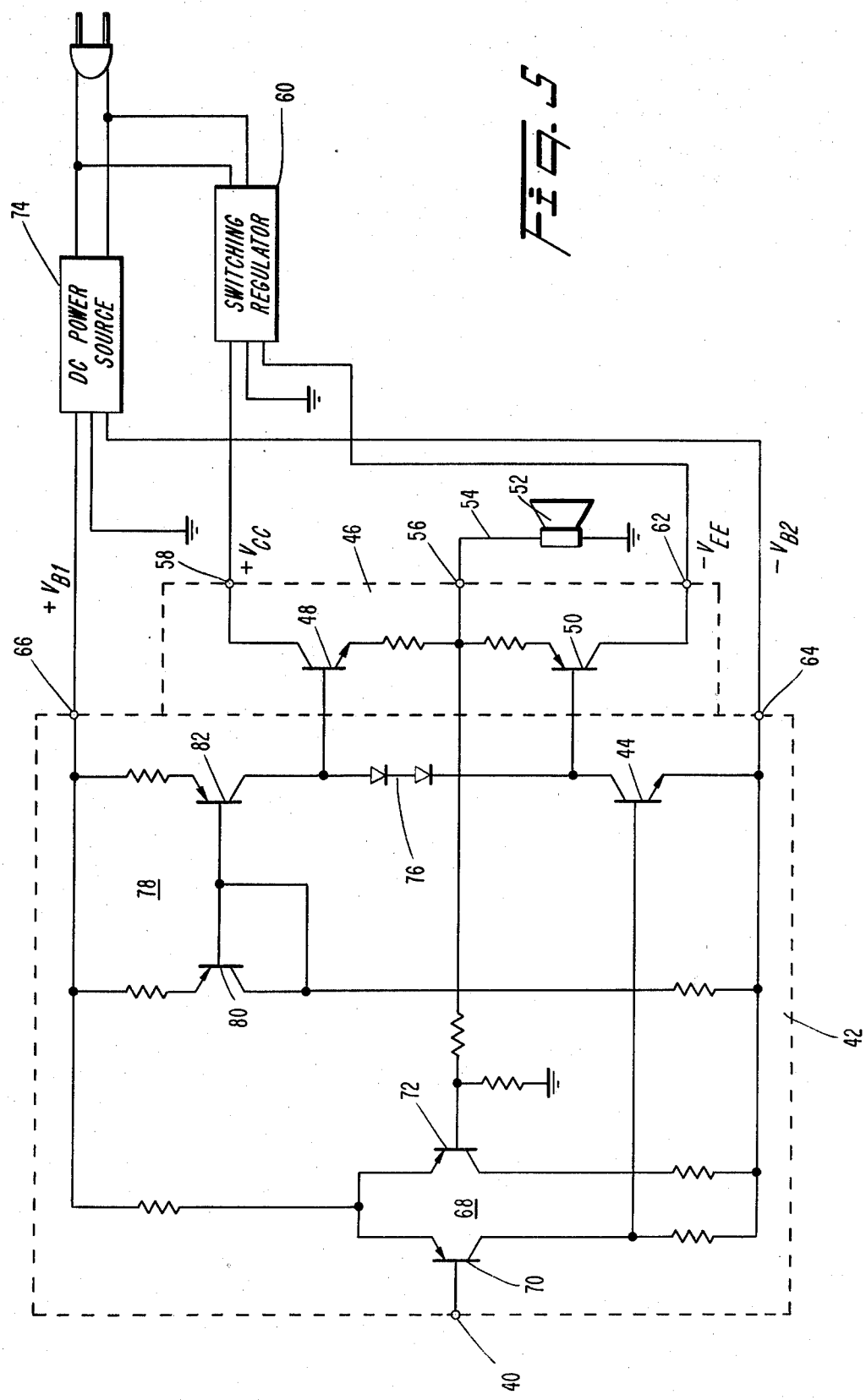
FIG. 5 shows a detailed schematic of another power amplifier embodying the present invention.

FIG. 5 shows a detailed circuit diagram embodying the present invention. In FIG. 5, like reference numerals of FIG. 3 will be used to designate like or equivalent portions, for the sake of simplicity of explanation. A signal input circuit 40 supplies an audio frequency input signal to a driver circuit 42. The input signal is first amplified by a differential amplifying section 68 including a pair of transistors 70 and 72, and then supplied to a driver transistor 44 from the collector of transistor 70. Driver transistor 44 is connected at its emitter to a negative DC voltage terminal 64 of a series regulator type DC power source 74. The collector of driver transistor 44 is connected through a biasing diode section 76 to an active load section 78 which is provided with a pair of transistors 80 and 82 each connected together in the form of conventional current mirror type constant current circuit. Active load section 78 has high load impedance for the transistor 44 so that the gain of driver circuit 42 increases. Active load section 78 is connected to a positive DC voltage terminal 66 of power source 74. An output signal from driver circuit 42 is supplied from both ends of biasing diodes section 76 to respective bases of a pair of complementary power transistors 48 and 50 each connected in single ended push-pull (SEPP) relationship. Emitters of power transistors 48 and 50 are connected in common to an output terminal 56 which supplies a power-amplified output signal for the power amplifying circuit 46 including power transistors 48 and 50 to a loudspeaker 52 through a cable 54. The collector of NPN power transistor 48 is coupled to a positive terminal 58 of the switching regulator type DC power source 60, while a collector of PNP power transistor 50 is connected to a negative terminal 62 of DC power source 60.

Switching regulator type DC power source 60 supplies a positive DC power source of 46 volts and a negative DC power source of $-46$ volts from its positive and negative terminals 58 and 62, while the series regulator type DC power source 74 supplies a positive DC power source of 41 volts and a negative DC power source of $-41$ volts from its positive and negative terminals 66 and 64.

An operation of the power amplifier shown in FIG. 5 is similar to that of the power amplifier shown in FIG. 3. That is, when a large amplitude input signal is supplied to driver circuit 42, driver transistor 44 is swung in a wide operation range from near its breakdown region to its saturation region by a large pre-amplified signal from differential amplifier section 68. Therefore, a collector potential of driver transistor 44 is swung between almost $-41$ volts and $+41$ volts so that the output signal supplied from biasing diodes section 76 to the bases of power transistors 48 and 50 is clipped similarly as waveform S' shown in FIG. 4. Accordingly, NPN power transistor 48 and PNP power transistor 50 conduct alternately according to the signal polarity. So, the emitter potential of NPN transistor 48 rises to the voltage of $+41$ volts at the time the signal is in a positive half cycle, but is limited to the voltage of $+41$ volts. Therefore, a collector-emitter voltage $V_{CE}$ of power transistor 48 is held at least to a voltage of $+5$ volts (equals to a difference between $+46$ volts and $+41$ volts) or more so that NPN power transistor 48 is prevented to go into its saturation region. Similarly, PNP power transistor 50 is also prevented to go into its saturation region during a negative half cycle because of the collector-emitter voltage $V_{CE}$ of transistor 50 is held at least to a voltage of 5 volts or more (in absolute value). Accordingly, both collector currents of power transistors 48 and 50 are prevented from being modulated by ripple components having a high frequency or higher harmonics leaked from switching regulator 60. As a result, distortion and spurious emissions based on the ripple components are reduced.

What we claim is:

1. A power amplifier comprising:
   an input circuit for receiving an input signal;
   a driver circuit connected to said input circuit including a driver transistor which amplifies the signal applied by said input circuit;
   an output circuit;
   a power amplifying circuit coupled between said driver circuit and said output circuit including a power transistor which power-amplifies the amplified signal from said driver circuit and provides a power-amplified output signal to said output circuit;
   a first power supply means of the switching regulator type connected to said power amplifying circuit for supplying a first DC power source voltage to said power amplifying circuit, said source voltage containing high frequency ripple components;
   a second power supply means connected to said driver circuit for supplying a second DC power source voltage to said driver circuit;
   said second power supply means having a lower DC voltage than said first DC power source voltage so that the amplitude peaks of the signal amplified by the driver circuit and applied to the power amplifier circuit are limited by the maximum voltage of the second DC voltage which is below the voltage level of the high frequency ripple components; the combination of the power amplifier circuit and the amplified output of the driver circuit acting to prevent saturation of the power transistor so that the power-amplified output signal is kept below the voltage level of the high frequency ripple components of the first DC power source voltage.

2. A power amplifier according to claim 1, wherein: said second power supply means is a battery.

3. A power amplifier according to claim 1 further comprising:
   a second power transistor in said power amplifying circuit, said second power transistor and said power transistor being connected as a push-pull amplifier.

4. A power amplifier according to claim 3, wherein: said second power supply means is a battery.

5. A power amplifier according to claim 1 or 3 wherein:
   the power amplifier circuit is directly coupled to the driver circuit.

6. A power amplifier according to claim 1 or 3 wherein:
   each power transistor is connected as an emitter follower.

* * * * *